United States Patent
Brooker et al.

(10) Patent No.: US 10,615,564 B2
(45) Date of Patent: Apr. 7, 2020

(54) SINUSOIDAL PHASE MODULATION OF MODE-LOCKED LASERS

(71) Applicant: Thorlabs, Inc., Newton, NJ (US)

(72) Inventors: Jeffrey S. Brooker, Manassas, VA (US); William Radtke, Ellicott City, MD (US); Hongzhou Ma, Centerville, VA (US); Eric Lieser, Boyce, VA (US)

(73) Assignee: Thorlabs, Inc., Newton, NJ (US)

( * ) Notice: Subject to any disclaimer, the term of this patent is extended or adjusted under 35 U.S.C. 154(b) by 0 days.

(21) Appl. No.: 15/986,518

(22) Filed: May 22, 2018

(65) Prior Publication Data
US 2018/0342847 A1 Nov. 29, 2018

Related U.S. Application Data

(60) Provisional application No. 62/510,072, filed on May 23, 2017.

(51) Int. Cl.
| | |
|---|---|
| *H01S 3/107* | (2006.01) |
| *H01S 3/10* | (2006.01) |
| *H03K 4/92* | (2006.01) |
| *G02F 1/03* | (2006.01) |
| *H01S 3/11* | (2006.01) |

(52) U.S. Cl.
CPC .......... *H01S 3/107* (2013.01); *H01S 3/10053* (2013.01); *H03K 4/92* (2013.01); *G02F 1/03* (2013.01); *H01S 3/1109* (2013.01)

(58) Field of Classification Search
CPC ...... H01S 3/0085; H01S 3/107; H01S 3/1109; H01S 3/1106; H01S 3/1112; G02F 1/03; G02F 1/0311
See application file for complete search history.

(56) References Cited

U.S. PATENT DOCUMENTS

| | | | | |
|---|---|---|---|---|
| 3,613,028 A | * | 10/1971 | Seidel | H01S 3/1109 372/18 |
| 3,827,000 A | * | 7/1974 | Matsushita | G02F 1/0322 359/259 |
| 4,968,881 A | * | 11/1990 | Takahashi | G01R 15/242 250/231.1 |
| 2004/0253000 A1 | | 12/2004 | Grifin | |
| 2006/0039419 A1 | | 2/2006 | Deshi | |

(Continued)

FOREIGN PATENT DOCUMENTS

GB 2336938 A 11/1999

OTHER PUBLICATIONS

International search report and written opinion issued for corresponding International Patent Application No. PCT/US2018/033929, dated Oct. 25, 2018.

(Continued)

*Primary Examiner* — Michael Carter
(74) *Attorney, Agent, or Firm* — Myers Wolin, LLC

(57) ABSTRACT

A mode-locked laser comprising circuitry configured to drive an electro-optic modulator (EOM) in the mode-locked laser with a drive waveform, the drive waveform being a phase-coherent sinusoidal waveform at a frequency equal to a repetition rate of the mode-locked laser, a phase-coherent pulsed waveform at a frequency equal to the repetition rate of the mode-locked laser, or a phase-coherent sinusoidal waveform at a frequency equal to half of the repetition rate of the mode-locked laser.

13 Claims, 5 Drawing Sheets

(56) References Cited

U.S. PATENT DOCUMENTS

2010/0128744 A1    5/2010  Deladurantaye et al.
2014/0050235 A1    2/2014  Clowes et al.
2016/0359290 A1*  12/2016  Inaba .................... H01S 3/0085
2017/0187160 A1*   6/2017  Lowder ............... H01S 3/06754

OTHER PUBLICATIONS

Dallas et al., "Nd:YLF Laser for Airborne/Spaceborne Laser Ranging," Eighth International Workshop on Laser Ranging Instrumentation, NASA Goddard Space Flight Center; Greenbelt, MD, United States, Jun. 1, 1993, pp. 3-1 to 3-5.

Fujiwara et al., "Flattened optical multicarrier generation of 12.5 GHz spaced 256 channels based on sinusoidal amplitude and phase hybrid modulation," Electronics Letters, Jul. 19, 2001, pp. 967-968, vol. 37, Issue 15, Institution of Engineering and Technology.

International Search Report and written opinion issued by the International Searching Authority for corresponding International Patent Application No. PCT/US2019/052122, dated Nov. 28, 2019.

* cited by examiner

SINUSOIDAL PHASE MODULATION OF MODE-LOCKED LASERS

CROSS REFERENCE TO RELATED APPLICATIONS

This application claims the benefit of U.S. Provisional Patent Application No. 62/510,072 filed on May 23, 2017. The contents of U.S. Provisional Patent Application 62/510,072 are hereby incorporated by reference.

FIELD OF THE INVENTION

The invention generally relates to laser modulation techniques. More particularly, the invention relates to a modulation of a mode-locked laser using an electro-optic modulator (EOM) driven with a frequency and phase coherent AC waveform.

BACKGROUND

Mode-Locked Laser

Mode-locking is a technique in optics by which a laser can be made to produce pulses of light of extremely short duration, on the order of picoseconds ($10^{-12}$ s) or femtoseconds ($10^{-15}$ s).

The basis of the technique is to induce a fixed-phase relationship between the longitudinal modes of the laser's resonant cavity. The laser is then said to be "phase-locked" or 'mode-locked." Interference between these modes causes the laser light to be produced as a train of pulses. Depending on the properties of the laser, these pulses may be of extremely brief duration, as short as a few femtoseconds. The train of pulses is commonly in the 50-100 MHz repetition rate range.

Electro-Optic Modulator (EOM)

Electro-optic modulator (EOM) is an optical device in which a signal-controlled element exhibiting the electro-optic effect is used to modulate a beam of light. The modulation may be imposed on the phase, frequency, amplitude, or polarization of the beam.

The simplest kind of EOM consists of a crystal, such as lithium niobate, whose refractive index is a function of the strength of the local electric field. That means that if a lithium niobate crystal is exposed to an electric field, light will travel more slowly through it. But the phase of the light leaving the crystal is directly proportional to the length of time it takes for the light to pass through the crystal. Therefore, the phase of the laser light exiting an EOM can be controlled by changing the electric field applied to the crystal.

Combining this phase change with polarizers before and after the crystal, amplitude modulation can be achieved. When using an EOM as an amplitude modulator, the configuration is usually with two orthogonally aligned crystals. This helps reduce thermal drift. FIG. 1 shows an example setup of the EOM amplitude modulator.

The electro-optic amplitude modulator may be a Pockels cell type modulator consisting of two matched lithium niobate crystals 110, 120 packaged in a compact housing with an RF input connector. Applying an electric field to the crystal induces a change in the indices of refraction (both ordinary and extraordinary) giving rise to an electric field dependent birefringence which leads to a change in the polarization state of the optical beam. The Electro-optic crystal acts as a variable waveplate with retardance linearly dependent on the applied electric field. By placing a linear polarizer 140 at the exit, the beam intensity through the polarizer varies sinusoidally with linear change in applied voltage.

Electro-optic phase modulators provide a variable phase shift on a linearly polarized input beam. In one embodiment, the input beam is linearly polarized along the vertical direction which is the Z-axis of the crystal by a linear polarizer 130. A voltage at the RF input 150 is applied across the Z-axis electrodes 160 inducing a change in the crystal's extraordinary index of refraction thereby causing a phase shift in the optical signal.

DC Modulation

Two methods of DC control for amplitude modulation of mode-locked lasers are currently commonly used.

Existing techniques have achieved ~DC-1 MHz modulation control using a high voltage/high power DC coupled linear amplifier. This method allows control to any output intensity level over the course of 10 to 100 laser pulses. FIG. 2 shows a schematic diagram of a linear amplifier.

Several other EOM drive manufacturers use a push-pull arrangement to switch between two slowly varying DC levels. This method allows for switching between two output intensity levels over the course of 2 to 3 laser pulses. Changing those DC levels takes about 1,000 to 10,000 laser pulses. This approach is very effective in edge blanking of an image or other applications where an on-off feature is needed. FIG. 3 shows a schematic diagram of a push-pull amplifier.

AC Modulation

Modulating the amplitude of a mode-locked laser with an AC waveform is commonly done. It is usually accomplished by adding circuitry to create a resonant tank between the EOM crystal (purely capacitive element) and other passive components. This resonant system can then be controlled by a relatively low power AC signal generator. Phase locking this system to the train of pulses from the mode-locked laser allows the overlay of a signal on the output intensity of the train of pulses. As shown in FIG. 4, an AC waveform 410 is applied to the output pulses 420 of a mode-locked laser, resulting in a modulated amplitude output 430.

The modulation techniques discussed above have the drawback that it takes many pulses to change the output amplitude from one value to another desired value. However, there is a need to increase the speed of modulation. In particular, a pulse-by-pulse control of the laser power would provide improvements of and open up many new uses of mode-locked lasers.

SUMMARY

An embodiment of the present invention is an extension of the AC modulation scheme already commonly in use. By using power RF techniques it is possible to modulate the phase or amplitude of the EOM drive very rapidly. Simulations suggest that there are multiple possible methods of using an AC EOM drive signal to perform amplitude modulation of the laser intensity in less than one laser pulse over the full range of the EOM contrast ratio. This allows pulse-by-pulse control of the laser power. Many applications requiring pulsed laser modulation would benefit from an increase in the speed of modulation over the current state of the art.

One embodiment of the invention provides a mode-locked laser comprising circuitry configured to drive an electro-optic modulator (EOM) in the mode-locked laser with a drive waveform, the drive waveform being a phase-coherent sinusoidal waveform at a frequency equal to a repetition rate of the mode-locked laser.

Another embodiment of the invention provides a mode-locked laser comprising circuitry configured to drive an electro-optic modulator (EOM) in the mode-locked laser with a drive waveform, the drive waveform being a phase-coherent pulsed waveform at a frequency equal to a repetition rate of the mode-locked laser.

Another embodiment of the invention provides a mode-locked laser comprising circuitry configured to drive an electro-optic modulator (EOM) in the mode-locked laser with a drive waveform, the drive waveform being a phase-coherent sinusoidal waveform at a frequency equal to half of a repetition rate of the mode-locked laser.

DETAILED DESCRIPTION OF THE PREFERRED EMBODIMENTS

Figure 1:
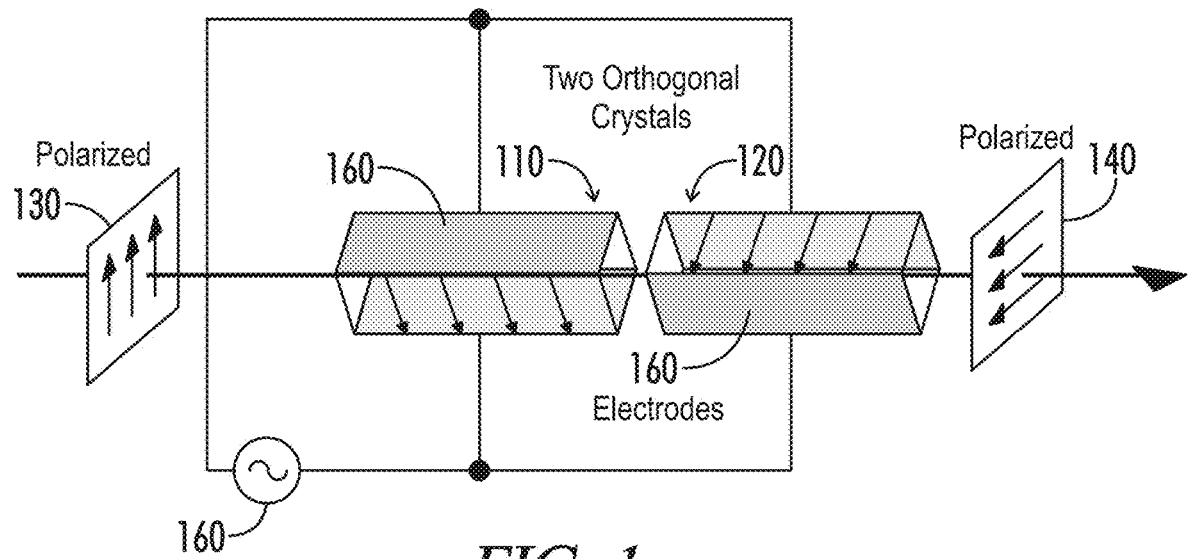
FIG. 1 shows a schematic diagram of an EOM Amplitude Modulator.
Figure 2:
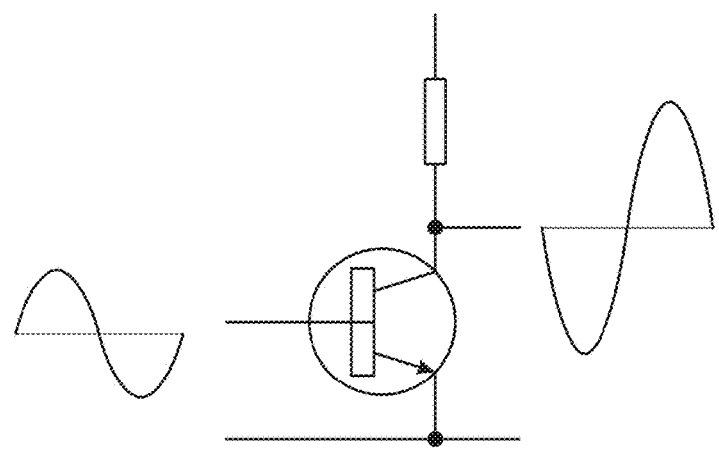
FIG. 2 shows a schematic diagram of a linear amplifier.
Figure 3:
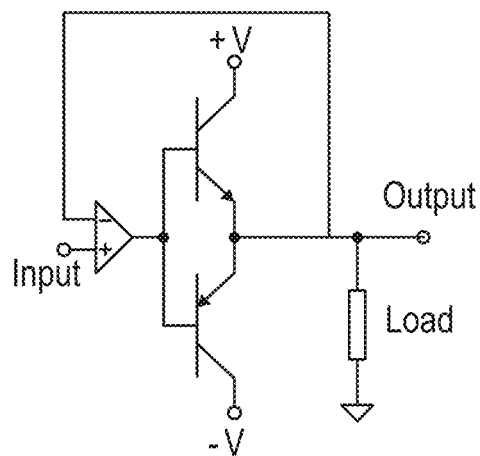
FIG. 3 shows a schematic diagram of a push-pull amplifier.
Figure 4:
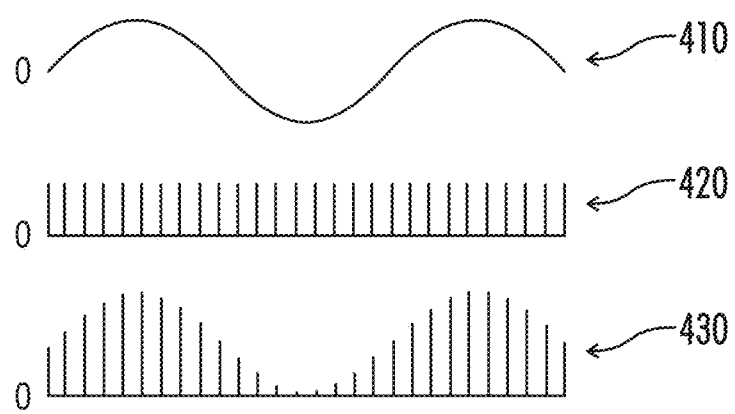
FIG. 4 illustrates an amplitude modulation with an AC waveform.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

Figure 5:
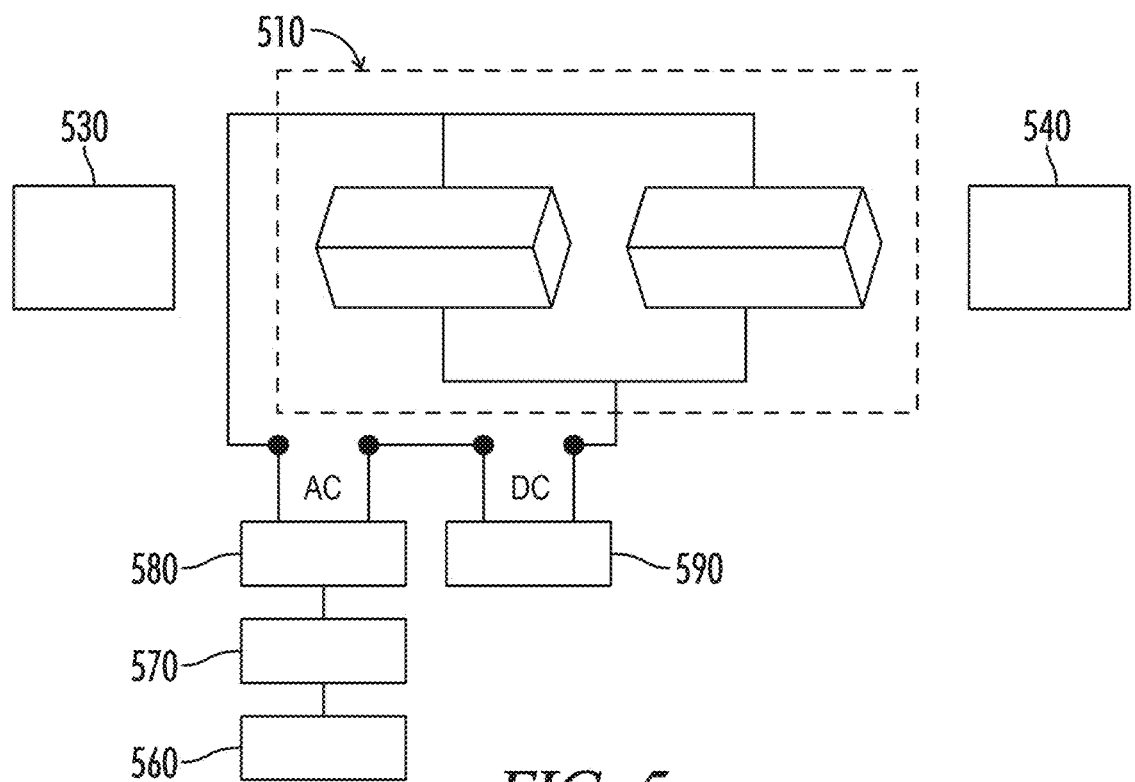
FIG. 5 shows an EOM amplitude modulation assembly according to an embodiment.

FIG. 5 shows a setup of the modulator according to an embodiment. Similar to the setup of FIG. 1, the EOM 510 is placed between two polarizers 530, 540. A custom circuit 560 is used to lock to the laser and create a phase locked signal, with the ability to step phase shift that signal, to a RF power amplifier 570 which drives a transformer 580 providing the AC voltage to the EOM. A DC input (offset) 590 is used to adjust the location of the AC signal within the range of the EOM. The AC signal used for this setup is well below the required amplitude for full contrast laser modulation.

Figure 6:
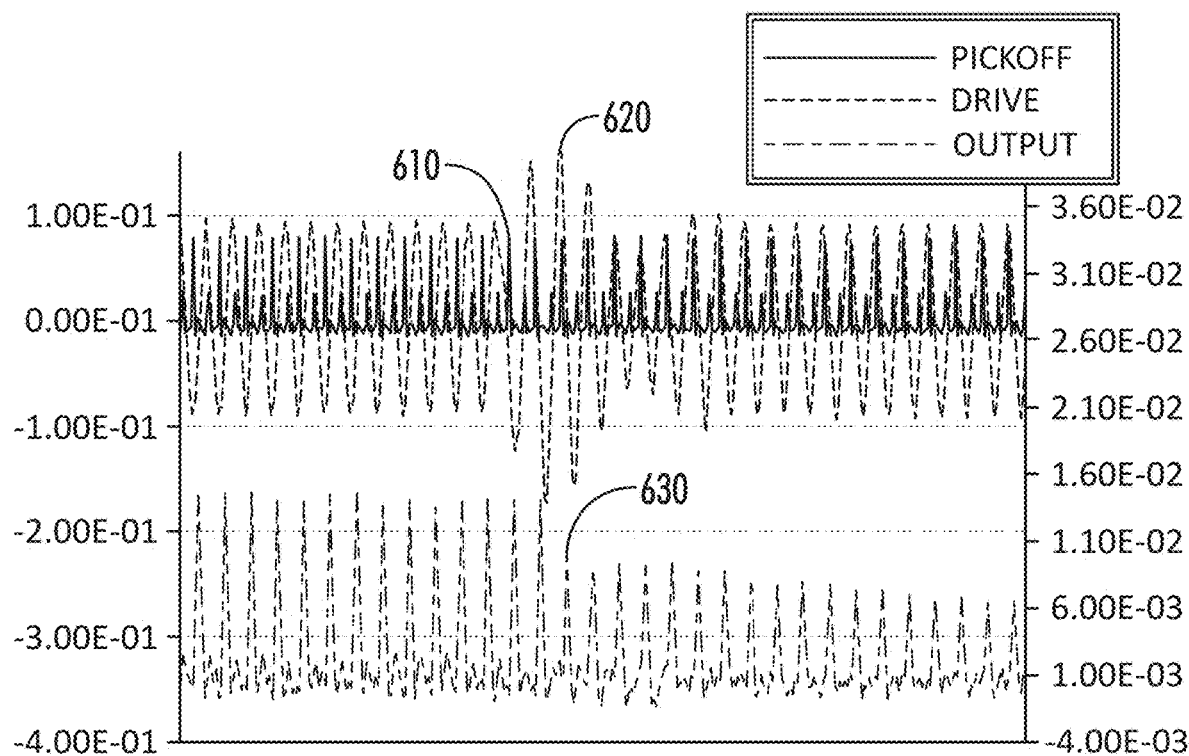
FIG. 6 illustrates the test results of the EOM amplitude modulation assembly according to an embodiment.

Tests were performed using the setup shown in FIG. 5, and the results are shown in FIG. 6. The waveform 610 shows the pulses from the pickoff before the EOM amplitude modulation assembly. Waveform 620 is the drive waveform, generated by the custom phase sync circuit, sent to the power amplifier. Note the 180 degree phase change halfway through the data set. The waveform 630 is the output detector indicating laser intensity.

This shows that using this method, laser intensity of a mode-locked laser can be modulated to arbitrary levels within 2-3 laser pulses on an 80 MHz repetition rate laser. This superior modulation speed is not achieved by any of the existing techniques.

In one embodiment, a sinusoidal waveform, which is representative of the EOM modulation waveform, is expressed as:

$$v_s(t) = V_P \sin(2\pi f t + \varphi),$$

where $V_P$ is the amplitude, or "Peak Amplitude" of the waveform, f is frequency in Hz, and $\varphi$ is the phase in radians. Note that there are other representations of amplitude, for example, $V_{RMS} = V_P/\sqrt{2}$ (Root Mean Square Amplitude) or $V_{Peak-Peak} = 2V_P$ (Peak-to-Peak Amplitude).

A periodic impulse train, which is representative of pulsed lasers, is expressed as:

$$p(t) = \sum_{n=-\infty}^{\infty} \delta(t - nT_s)$$

where $T_s$ is the period of the pulses. This means that laser pulses occur at $t=0$, $t=T_s$, $t=2T_s$, ..., etc. Now the phase of the EOM drive sinusoid is relative to this and is defined by $\varphi$. The voltage on the EOM is relevant only at the instant in time when the laser pulse is present in the EOM material (crystal). That means the voltage on the sinusoidal waveform is relevant only at time $t=0$, $t=T_s$, $t=2T_s$, ..., etc. The drive voltage is thus the sinusoid equation evaluated at those instants in time, and now looks like a discrete-time sampled signal:

$$v_s(nT_s) = V_P \sin(2\pi f n T_s + \varphi), n=0,1,2,...$$

When the sinusoid waveform is frequency locked to the laser, we have $f=1/T_s$=repetition rate of the mode-locked laser. This is the key innovation concept from which the present invention is derived. In some embodiments, this concept may be extended to a drive waveform having a phase-coherent pulsed waveform at a frequency equal to the repetition rate of the mode-locked laser, as well as to drive waveform having a phase-coherent sinusoidal waveform at a frequency equal to $1/(2T_s)$, etc.

Figure 7:
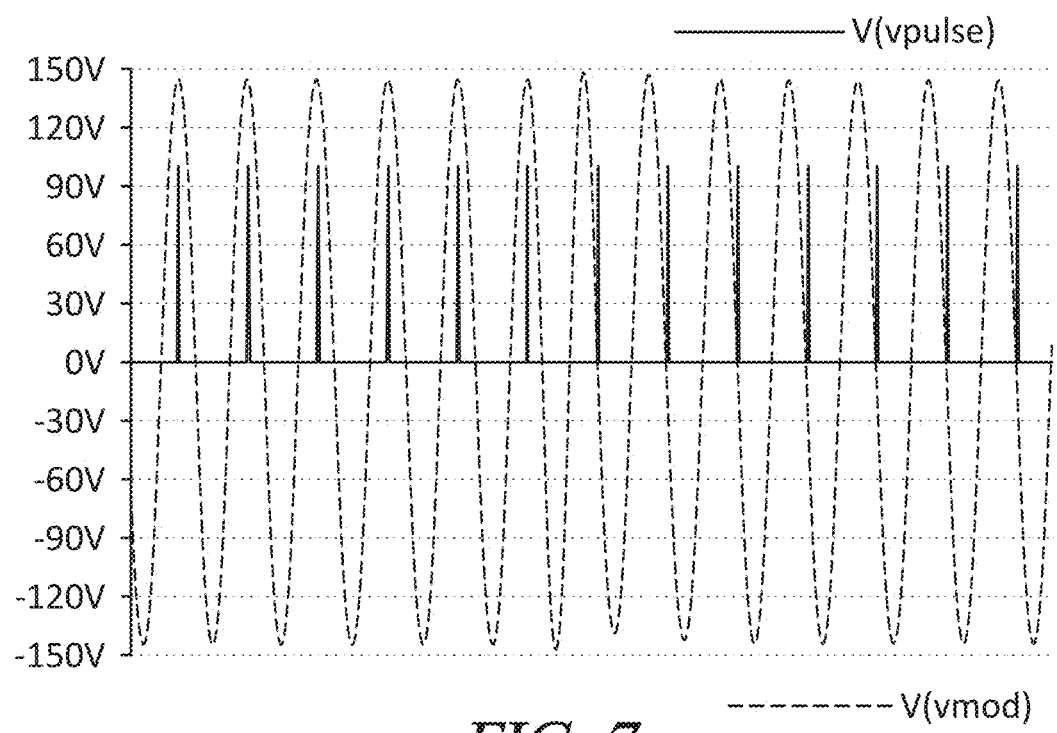
FIG. 7 shows a waveform where a phase shift of 90° is used to shift the drive waveform relative to the laser pulse according to an embodiment.

FIG. 7 shows a waveform where a phase shift of 90° is used to shift the drive waveform relative to the laser pulse, and thus change the voltage on the EOM at the instant the pulse arrives such that the voltage on the EOM changes from $V_P$ to 0.

Note that shifting the phase another 90° (for a total of 180°) will change the voltage to $-V_P$, doubling the voltage range available to drive the EOM.

Figure 8:
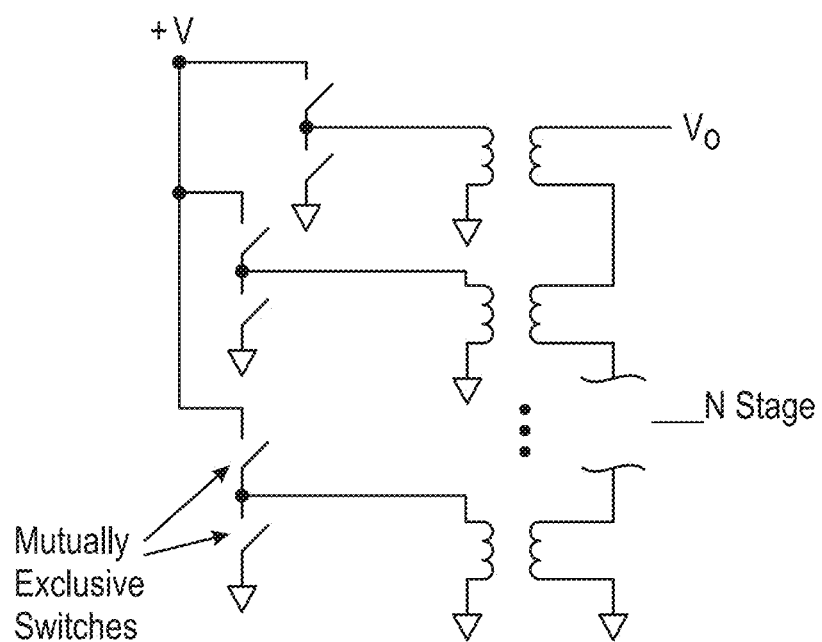
FIG. 8 is a schematic circuit diagram of the series of connected pulse generating stages according to an embodiment.

In one embodiment, a discrete number of pulse amplitudes are generated by a series of connected pulse generating stages. FIG. 8 is a schematic circuit diagram of the series of connected pulse generating stages according to an embodiment.

When a DC bias ($V_{DC\ BIAS}$) is applied, the drive waveform is expressed as:

$$v_s(nT_s)=V_P \sin(2\pi fnT_s+\varphi)+V_{DC\ BIAS}, n=0,1,2, \ldots$$

Figure 9:
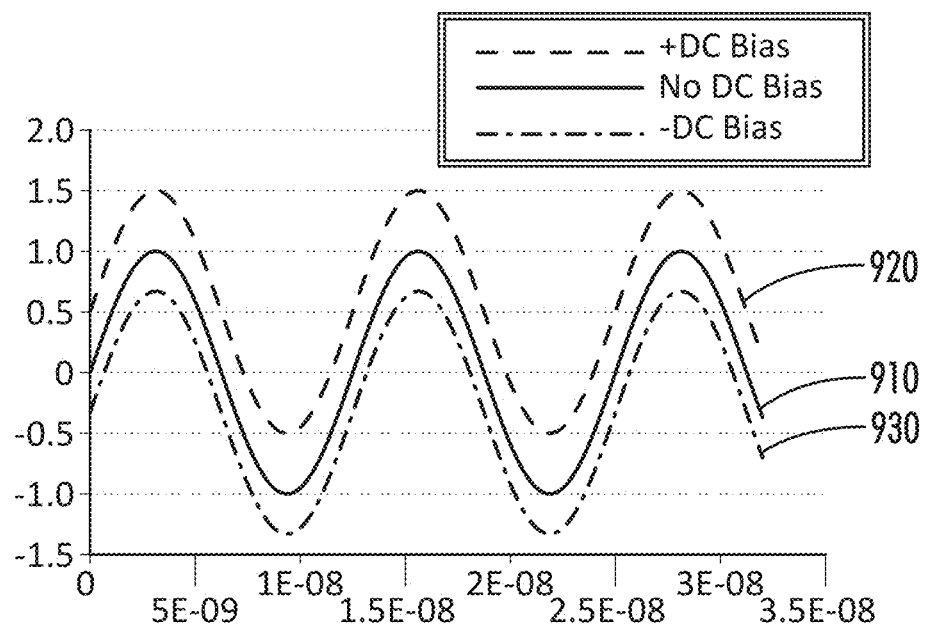
FIG. 9 shows the waveforms with various DC bias according to an embodiment.
Figure 10:
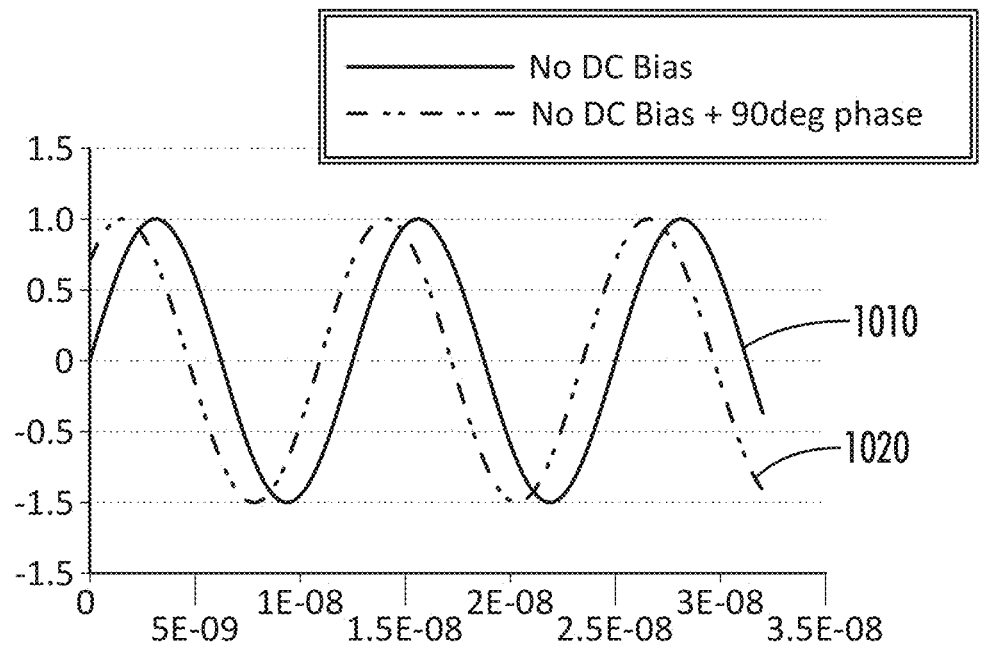
FIG. 10 shows the waveforms with and without phase shift according to an embodiment.

FIG. 9 shows the waveforms with: (1) no DC bias 910, (2) +DC bias 920 and (3) −DC bias 930 is applied. FIG. 10 shows the cases where (1) no DC bias is applied 1010 and (2) no DC bias is applied with +90 degrees phase shift 1020.

In one embodiment, a DC bias is applied such that the waveform is centered with symmetrical positive and negative voltages having substantially equal EOM optical phase shift.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A mode-locked laser having a pulse duration $<10^{-12}$ s, comprising circuitry configured to drive an electro-optic modulator (EOM) in the mode-locked laser with a drive waveform, the drive waveform being a phase-coherent sinusoidal waveform at a frequency equal to a repetition rate of the mode-locked laser;
   wherein an amplitude of the laser output varies as a sinusoidal function of a phase of the drive waveform relative to the mode-locked laser.

2. The mode-locked laser of claim 1, wherein the sinusoidal waveform is phase modulated over a 90 degree range having amplitude range of V peak.

3. The mode-locked laser of claim 1, wherein the sinusoidal waveform is phase modulated over a 180 degree range having an amplitude range of V peak-to-peak.

4. The mode-locked laser of claim 2, wherein a DC bias is applied to the sinusoidal waveform.

5. The mode-locked laser of claim 3, wherein a DC bias is applied to the sinusoidal waveform.

6. The mode-locked laser of claim 1, wherein the EOM is configured to generate an amplitude modulated output.

7. The mode-locked laser of claim 6, wherein a DC bias is applied to the sinusoidal waveform.

8. The mode-locked laser of claim 1, wherein the EOM comprises a Pockels cell.

9. The mode-locked laser of claim 1, wherein a DC bias is applied such that the waveform is centered with symmetrical positive and negative voltages having substantially equal EOM optical phase shift.

10. A mode-locked laser having a pulse duration $<10^{-12}$ s, comprising circuitry configured to drive an electro-optic modulator (EOM) in the mode-locked laser with a drive waveform, the drive waveform being a phase-coherent sinusoidal waveform at a frequency equal to half of a repetition rate of the mode-locked laser;
    wherein an amplitude of the laser output varies as a sinusoidal function of a phase of the drive waveform relative to the mode-locked laser.

11. The mode-locked laser of claim 10, the EOM is configured to generate a phase modulated output.

12. The mode-locked laser of claim 10, the EOM is configured to generate an amplitude modulated output.

13. The mode-locked laser of claim 10, wherein the EOM comprises a Pockels cell.

* * * * *